United States Patent
Grodzki (10) Patent No.: US 10,126,393 B2
(45) Date of Patent: Nov. 13, 2018

(54) METHOD FOR MAGNETIC RESONANCE FINGERPRINTING

(71) Applicant: SIEMENS AKTIENGESELLSCHAFT, München (DE)

(72) Inventor: David Grodzki, Erlangen (DE)

(73) Assignee: SIEMENS AKTIENGESELLSCHAFT (DE)

( * ) Notice: Subject to any disclaimer, the term of this patent is extended or adjusted under 35 U.S.C. 154(b) by 568 days.

(21) Appl. No.: 14/809,652

(22) Filed: Jul. 27, 2015

(65) Prior Publication Data
US 2016/0033604 A1 Feb. 4, 2016

(30) Foreign Application Priority Data
Jul. 29, 2014 (DE) ........................ 10 2014 214 828

(51) Int. Cl.
*G01V 3/00* (2006.01)
*G01R 33/48* (2006.01)
(Continued)

(52) U.S. Cl.
CPC ..... *G01R 33/4828* (2013.01); *G01R 33/5608* (2013.01); *G01R 33/448* (2013.01);
(Continued)

(58) Field of Classification Search
CPC ................................................ G01R 33/5608
(Continued)

(56) References Cited

U.S. PATENT DOCUMENTS

| 6,377,834 B1* | 4/2002 | Zhou ...................... A61B 5/055 324/315 |
| 7,366,560 B2 | 4/2008 | Taicher |

(Continued)

FOREIGN PATENT DOCUMENTS

WO    WO 2014047326 A1    3/2014

OTHER PUBLICATIONS

Oppelt A.; "Imaging Systems for Medical Diagnostics"; Publicis Corporate Publishing Erlangen; pp. 148-151; ISBN 3-89578-226-2; 2005.
(Continued)

*Primary Examiner* — Louis Arana
(74) *Attorney, Agent, or Firm* — Schmeiser, Olsen & Watts, LLP (57) ABSTRACT

A method for magnetic resonance fingerprinting and to a magnetic resonance device is provided. The method for magnetic resonance fingerprinting includes the following method steps—detecting a magnetic resonance signal waveform of an examination area of an examination object by means of a magnetic resonance fingerprinting method, comparing the detected magnetic resonance signal waveform with a number of signal waveforms stored in a database, wherein a database value of at least one tissue parameter is assigned to each of the database signal waveforms, and determining a value of the at least one tissue parameter on the basis of the signal comparison, wherein an influence of a temperature of the examination object on the magnetic resonance signal waveform is taken into consideration in the further processing of the magnetic resonance signal waveform.

12 Claims, 3 Drawing Sheets

(51) Int. Cl.
  *G01R 33/56* (2006.01)
  *G01R 33/44* (2006.01)
  *G01R 33/483* (2006.01)
  *G01R 33/563* (2006.01)
(52) U.S. Cl.
  CPC ........ *G01R 33/483* (2013.01); *G01R 33/4804* (2013.01); *G01R 33/4814* (2013.01); *G01R 33/56341* (2013.01)
(58) Field of Classification Search
  USPC ................................ 324/307, 309, 312, 314
  See application file for complete search history.

(56) References Cited

U.S. PATENT DOCUMENTS

| | | |
|---|---|---|
| 9,689,942 B2 * | 6/2017 | Morgan ................. G01R 33/46 |
| 2012/0235678 A1 | 9/2012 | Seiberlich et al. |
| 2013/0265047 A1 | 10/2013 | Griswold et al. |
| 2017/0023658 A1 * | 1/2017 | Sun ........................ A61B 5/055 |
| 2017/0319098 A1 * | 11/2017 | Wang ..................... A61B 5/055 |

OTHER PUBLICATIONS

Ma Dan et al. "Magnetic resonance fingerprinting", Nature 495. 7440, Mar. 14, 2013, pp. 187-192, doi:10.1038/nature11971; 2013.

* cited by examiner

METHOD FOR MAGNETIC RESONANCE FINGERPRINTING

CROSS-REFERENCE TO RELATED APPLICATIONS

This application claims priority to German Application No. DE 102014214828.6, having a filing date of Jul. 29, 2014, the entire contents of which are hereby incorporated by reference.

FIELD OF TECHNOLOGY

The following relates to a method for magnetic resonance fingerprinting and to a magnetic resonance device.

BACKGROUND

In a magnetic resonance device, also called a magnetic resonance tomography system, the body of the person to be examined, especially a patient, is usually exposed, with the aid of a main magnet, to a relatively high magnetic field, of 1.5 or 3 or 7 Tesla for example. In addition gradient pulses are emitted with the aid of a gradient pulse unit. Radio frequency pulses, especially excitation pulses, are then emitted via a radio-frequency antenna unit by means of suitable antenna devices, which leads to the nuclear spins of specific atoms excited resonantly by these high frequency pulses being flipped by a defined flip angle in relation to the magnetic field lines of the main magnetic field. During the relaxation of the nuclear spins radio-frequency signals, so called magnetic resonance signals, are emitted which are received by means of suitable radio frequency antennas and then further processed. From the raw data of an examination volume thus acquired the desired magnetic resonance image data of the examination volume can finally be reconstructed.

A magnetic resonance fingerprinting method, by means of which quantitative values of tissue parameters of an examination object can be determined, is known from the document Ma et al., "Magnetic Resonance Fingerprinting", Nature, 495, 187-192 (14 Mar. 2013).

SUMMARY

An aspect relates to a magnetic resonance fingerprinting examination tailored especially advantageously to the measurement conditions.

Embodiments of the invention are based on a method of the magnetic resonance fingerprinting, comprising the following method steps:
Detecting a magnetic resonance signal waveform of an examination area of an examination object by means of a magnetic resonance fingerprinting method,
Comparing the detected magnetic resonance signal waveform with a number of database signal waveforms stored in a database, wherein a database value of at least one tissue parameter is assigned to each of the database signal waveforms, and
Determining a value of the at least one tissue parameter on the basis of the signal comparison, characterized in that an influence of a temperature of the examination object on the magnetic resonance signal waveform is taken into consideration in the further processing of the magnetic resonance signal waveform.

The examination object can be a patient, a training person or a phantom. The value of the at least one tissue parameter can be provided after its determination. For example the value of the at least one tissue parameter can be displayed to user on a display unit and/or stored in a database. In particular a locally-resolved distribution of the value of the at least one tissue parameter is determined in the examination area. The at least one tissue parameter advantageously characterizes a physical characteristic of tissue of the examination object, from which the magnetic resonance signal waveform has been detected. In particular the at least one tissue parameter can quantify a reaction of the tissue to a radio-frequency excitation. Tissue of the examination object can for example be brain tissue, bone tissue, fatty tissue, muscle tissue etc. Naturally tissue parameters for other types of tissue of the examination object appearing sensible to the person skilled in the art can be determined. The at least one tissue parameter can be formed by one or more of the following tissue parameters: A T1 relaxation time, a T2 relaxation time, a diffusion value (for example an apparent diffusion coefficient, ADC), a magnetization moment, a proton density, a resonant frequency, a concentration of a substance, a temperature etc. Naturally further parameters appearing sensible to the person skilled in the art are also conceivable. A number of values of different tissue parameters can also be determined, wherein any given combination of the said tissue parameters is conceivable here.

The magnetic resonance fingerprinting method typically comprises acquisition of a number of magnetic resonance images of the examination area, wherein different recording parameters are set for the acquisition of the different magnetic resonance images. The recording parameters in this case can be varied in a pseudo-randomized manner. Possible recording parameters which are changed during the acquisition of the number of magnetic resonance images are for example an echo time, an embodiment and/or number of radio frequency pulses, an embodiment and/or number of gradient pulses, a diffusion encoding etc. The number of magnetic resonance images can in this case be acquired during a number of repetition times, wherein one magnetic resonance image of the number of magnetic resonance images can be acquired during one repetition time in each case. The location-dependent magnetic resonance signal waveform in particular is then generated over the number of magnetic resonance images.

In particular the different database signal waveforms are each assigned a different value of the at least one tissue parameter. The database signal waveforms especially represent the signal waveform to be expected during the magnetic resonance fingerprinting method if a sample, of which the value of the at least one tissue parameter corresponds to the database value, is examined. The database signal waveforms can be established and/or simulated for example in a calibration measurement. The magnetic resonance fingerprinting method then typically makes provision for a database signal waveform of the number of signal waveforms to be assigned to the acquired magnetic resonance signal waveform on the basis of the result of the signal comparison. The database value of the at least one tissue parameter belonging to the assigned database signal waveform can then be set as the measured value of the at least one tissue parameter. Thus the value of the at least one tissue parameter can be determined on the basis of the signal comparison. The value of the at least one tissue parameter determined on the basis of the signal comparison then especially represents an actual measured value, while the database values of the at least one tissue parameter represent virtual values of the at least one tissue parameter.

The database signal waveforms can also be assigned in each case to a number of database values of a number of tissue parameters. Then, by means of a signal comparison, a number of values of the at least one tissue parameter can be determined simultaneously. Only the acquisition of a single magnetic resonance signal waveform for a voxel of the examination area is necessary in order to determine all values of the number of tissue parameters by means of the magnetic resonance fingerprinting method. For a more detailed description of a typical way in which a magnetic resonance fingerprinting method functions the reader is referred to the document by Ma et al. cited above.

The temperature of the examination object especially means a temperature which is present within the body of the examination object and/or which represents a temperature of internal organs of the examination object. The temperature of the examination object can change in such cases, for example as a result of the fever of the examination object. The consideration underlying embodiments of the invention are that the value of the at least one tissue parameter of the examination object typically depends on a temperature, especially a body temperature, of the examination object. For example relaxation times of spins, especially a T1 relaxation time, are dependent on a temperature of the examination object. A change to the temperature of the examination object can thus lead to a measurement of different values of the at least one tissue parameter, although the same tissue of the examination object is being examined. Also different temperatures of the examination object can lead to the problem that a calibration measurement and/or a simulation for creating the database signal waveforms is based on a different temperature of the examination object than for a measurement of the magnetic resonance signal waveform. This can lead to incorrect assignments of the measured magnetic resonance signal waveform to the database signal waveforms and thus to an incorrect determination of the value of the at least one tissue parameter. Taking account of the temperature during the magnetic resonance fingerprinting method thus leads to a reduction of incorrect assignments of the measured magnetic resonance signal waveform to the database signal waveforms.

Thus, precisely with the magnetic resonance fingerprinting method presented, temperature of the examination object can have a great influence on the measurement data. By contrast, with a conventional magnetic resonance recording, in which typically magnetic resonance images with a qualitative image content are recorded, an influence of a temperature of the examination object is typically negligible. The reason for this, inter alia, is that the image information from magnetic resonance images obtained from qualitative methods, for example magnetic resonance images with a T2 weighting, is typically only based on one signal comparison within a magnetic resonance image.

Taking into account the influence of the temperature of the examination object on the magnetic resonance signal waveform in the further processing of the magnetic resonance signal waveform advantageously leads to an improvement of the magnetic resonance fingerprinting method. To this end the temperature can for example be taken into consideration during signal comparison of the acquired magnetic resonance signal waveform with the database signal waveforms. Advantageously, in the further processing of the magnetic resonance signal waveform, for example during the signal comparison, a temperature parameter is then used and/or defined. The temperature parameter in this case characterizes in particular a temperature of the examination object.

Taking account of the influence of the temperature of the examination object on the magnetic resonance signal waveform can also make an especially simple determination of the temperature of the examination object possible, as described in one of the following sections.

A form of embodiment makes provision for a temperature of the examination object to be measured by means of a temperature measurement at a defined location in the examination object by means of a magnetic resonance fingerprinting method. The temperature determination by means of the magnetic resonance fingerprinting method can in this case be decoupled from the determination of the value of the at least one tissue parameter. The temperature measurement in this case can be carried out before the signal comparison of the acquired magnetic resonance signal waveform with the database signal waveforms. Then the signal comparison can be carried out on the basis of the determined temperature. The temperature measurement by means of the magnetic resonance fingerprinting method can be carried out in this case by means of the method already described. Advantageously in this case the already acquired magnetic resonance signal waveform can be used to determine the temperature. If necessary a further magnetic resonance signal waveform can also be measured for the temperature measurement. In this case it is especially advantageous that the temperature is measured in a specific tissue in the examination object. For this it is advantageous to acquire the magnetic resonance signal waveform at a specific point in the examination object for the temperature examination. In the case of a brain examination for example the liquor substance is for example a suitable point for determining the temperature, since, since it is very easy to recognize in magnetic resonance images. Temperature database signal waveforms from the determined tissue which are assigned different temperatures can be stored in a temperature database, which can be different from the database. On the basis of a comparison of the measured magnetic resonance signal waveform and the temperature database signal waveforms, the temperature of the examination object can then be established. For the temperature measurement it can be sufficient in this case to determine the magnetic resonance signal waveform of an individual voxel. For an increase in the accuracy of the temperature measurement the temperature can also be determined and averaged for a number of signal waveforms established from different voxels.

One form of embodiment makes provision for each of the database signal waveforms stored in the database to be assigned a temperature range. The database is then especially embodied as a temperature-dependent database. Then the database signal waveforms each especially represent the signal waveform to be expected in the magnetic fingerprinting method when a sample is examined, of which the value of the at least one tissue parameter corresponds to the associated database value at a specific temperature which lies in the temperature range stored in the database signal waveform. Thus a number of database signal waveforms are stored especially in the database for a specific database value of the at least one tissue parameter, wherein each of the number of database signal waveforms is assigned a temperature range. For this the database signal waveforms which are assigned to a database value of the at least one tissue parameter can be established in a calibration measurement and/or simulations during variation of the temperature. For example in such cases a temperature range of 35° C. to 42° C. can be covered. This temperature-dependent database can offer an especially advantageous starting point for taking account of different temperatures of the examination object during a magnetic resonance fingerprinting method. For example the magnetic resonance signal waveforms to which different temperature ranges are assigned can be compared and thus the appropriate value of the at least one tissue parameter, possibly also in combination with the associated temperature, can be defined. It is especially advantageous, as described in the following section, to restrict the temperature-dependent database before the signal comparison on the basis of a measured temperature.

One form of embodiment makes provision for a temperature of the examination object to be measured and for the magnetic resonance signal waveform to be compared with those signal waveforms of the number of database signal waveforms in the temperature range of which the measured temperature of the examination object lies. The temperature is advantageously determined by means of a magnetic resonance fingerprinting method. It is also conceivable for the temperature of the examination object to be determined by means of a separate temperature measurement facility, for example a fever thermometer, especially before the acquisition of the magnetic resonance signal waveform. In particular the magnetic resonance signal waveform is then exclusively compared with those database signal waveforms of the number of database signal waveforms in the temperature range of which the measured temperature of the examination object lies. Thus the temperature-dependent database is advantageously restricted for the signal comparison to the temperature range in which the measured temperature of the examination object lies. Thus an especially advantageous establishment of the value of the at least one tissue parameter, taking into account the temperature of the examination object, is possible.

One form of embodiment makes provision for a temperature of the examination object to be measured and for the determination of the value of the at least one tissue parameter to include: Determining a provisional value of the at least one tissue parameter on the basis of the signal comparison and adapting the provisional value of the at least one tissue parameter to the measured temperature of the examination object. The provisional value of the at least one tissue parameter adapted to the measured temperature of the examination object then especially represents the value of the at least one tissue parameter. The provisional value of the at least one tissue parameter which is determined by means of the magnetic resonance fingerprinting method can thus be modified retrospectively, in order to adapt the measured temperature of the examination object. This is especially advantageous if no temperature-dependent database is employed for the signal comparison. However the process described here can also be combined with the use of a temperature-dependent database, in order for example to make it possible to take account of the temperature with greater precision.

One form of embodiment makes provision for the adaptation of the provisional value of the at least one tissue parameter to include a back calculation of the provisional value of the at least one tissue parameter of an output temperature to the measured temperature of the examination object. The output temperature in this case is typically the temperature on the basis of which the database signal waveforms have been determined in the calibration measurement and/or simulation. The initial temperature can be a standard body temperature of the examination object, for example 36.5° C. The back calculation of the at least one tissue parameter from the initial temperature to the measured temperature can be undertaken by means of a known temperature dependency of the at least one tissue parameter. The temperature dependency of the at least one tissue parameter typically has an exponential waveform in this case. The back calculation of the provisional value of the at least one tissue parameter to the measured temperature of the examination object advantageously enables a retrospective determination of the actual value of the at least one tissue parameter, especially when the temperature of the examination object is known during the acquisition of the magnetic resonance signal waveform. Thus the value of the at least one tissue parameter can be reliably determined, even when the examination object has a temperature outside a normal range during determination of the value of the at least one tissue parameter.

One form of embodiment makes provision for a temperature of the examination object to be determined on the basis of the specified value of the at least one tissue parameter. The aforementioned dependency of the value of the at least one tissue parameter on the temperature of the examination object can be used to determine a temperature of the examination object. Advantageously in this case a waveform of a temperature of the examination object, especially over the period of acquisition of the magnetic resonance signal waveform, can be determined. The determination of the temperature curve can be advantageous for different applications, such as monitoring of parallel radio-frequency excitations (pTX excitations), a magnetic resonance monitoring of therapies by means of highly-intensive focused ultrasound (HIFU therapy) or a magnetic resonance monitoring of kryotherapies for example. Naturally other applications of measuring the temperature curve of the examination object by means of magnetic resonance fingerprinting appearing sensible to the person skilled in the art are possible.

One form of embodiment makes provision for the temperature of the examination object to be determined using calibration data which is determined during a first period of the duration of the acquisition of the magnetic resonance signal waveform, wherein during the first period a calibration temperature of the examination object is known. Then in particular, during a second period of the duration of the acquisition of the magnetic resonance signal waveform, a temperature of the examination object can be determined using the calibration data. The second period can be disjoint in time from the first period in this case. Also a number of temperature values of the examination object can be determined during the second period using the calibration data. The calibration data is advantageously determined on the basis of a first part range of the magnetic resonance signal waveform, which is acquired during the first period. The calibration temperature can be established during the first period by means of a temperature measurement, as already described for example, by means of a magnetic resonance fingerprinting method. The calibration data offers an advantageous starting point for a measurement of a temperature of the examination object, especially of a temperature curve during the acquisition of the magnetic resonance signal waveform.

One form of embodiment makes provision for the determination of the temperature of the examination object to include: Determining a first value of the at least one tissue parameter based on a first part range of the magnetic resonance signal waveform, which is acquired during a first period of the duration of the acquisition of the magnetic resonance signal waveform, wherein during the first period a calibration temperature of the examination object is known, determination of a second value of the at least one tissue parameter on the basis of the second part range of the magnetic resonance signal waveform, which is acquired during a second period of the duration of the acquisition of the magnetic resonance signal waveform, wherein during the second period the temperature of the examination object to be determined is present and determination of the temperature of the examination object on the basis of a comparison of the first value and the second value of the at least one tissue parameter using the known calibration temperature. The first value of the at least one tissue parameter can be determined by means of a signal comparison between the first part range of the magnetic resonance signal waveform and a corresponding part range of the database signal waveforms. Similarly a determination of second value of the at least one tissue parameter is possible. For a temperature curve measurement typically a number of second values of the at least one tissue parameter are determined on the basis of a number of second part ranges of the magnetic resonance signal waveform, which are acquired during a number of second periods of the duration of the acquisition of the magnetic resonance signal waveform. The second periods are advantageously selected as short as possible for a high temporal resolution of the temperature curve measurement. Thus the second part ranges of the magnetic resonance signal waveform can be measured during less than 15 repetition times of the magnetic resonance fingerprinting measurement, advantageously during less than 10 repetition times of the magnetic resonance fingerprinting measurement, highly advantageously during fewer than 5 repetition times of the magnetic resonance fingerprinting measurement. The determination of the temperature of the examination object can then be carried out on the basis of a known dependency of the value of the at least one tissue parameter on the temperature. Thus an especially precise measurement of a temperature, advantageously of a temperature curve of the examination object is possible, simply based on magnetic resonance fingerprinting measurement data.

One form of embodiment makes provision for the second value of the at least one tissue parameter to be determined taking into account the first value of the at least one tissue parameter. Thus account can be taken of the fact that the first part range and the second part range of the magnetic resonance signal waveform are recorded from the same tissue of the examination object. Thus typically only an incremental deviation of the second value of the at least one tissue parameter from the first value of the at least one tissue parameter, which is merely caused by a variation of the temperature of the examination object, is to be expected. Advantageously, for the signal comparison to determine the second value of the at least one tissue parameter, the database is thus restricted such that the second part range of the magnetic resonance signal waveform is only compared with those database signal waveforms which are assigned restricted database values of the at least one tissue parameter. The restricted database values of the at least one tissue parameter in this case are preferably arranged in a restricted range of values around the first value of the at least one tissue parameter. The restricted database values of the at least one tissue parameter are preferably similar to the first value of the at least one tissue parameter. The determination of the second value of the at least one tissue parameter can be accelerated in this way.

Furthermore, embodiments of the invention are based on a magnetic resonance device comprising a signal waveform detection unit, a computing unit and a temperature consideration unit, whereby the magnetic resonance device is designed to execute an inventive method.

Thus, the magnetic resonance device is embodied to execute an inventive method for magnetic resonance fingerprinting. The signal waveform detection unit is embodied to detect a magnetic resonance signal waveform of an examination area of an examination object by means of a magnetic resonance fingerprinting method. The computing unit, especially a comparison unit of the computing unit, is embodied for comparing the detected magnetic resonance signal waveform with a number of database signal waveforms stored in a database, wherein each of the database signal waveforms is assigned a database value of at least one tissue parameter. Furthermore the computing unit, especially a determination unit of the computing unit, is embodied to determine a value of the at least one tissue parameter on the basis of the signal comparison. The temperature consideration unit is embodied to take into consideration an influence of a temperature of the examination object on the magnetic resonance signal waveform during further processing of the magnetic resonance signal waveform.

According to one form of embodiment of the magnetic resonance device the temperature consideration unit comprises a temperature measurement unit, which is embodied such that a temperature of the examination object is measured by a temperature measurement at a defined point in the examination object by means of a magnetic resonance fingerprinting method.

According to one form of embodiment of the magnetic resonance device the temperature consideration unit is embodied such that a temperature range is assigned to each of the database signal waveforms stored in the database.

According to one form of embodiment of the magnetic resonance device the temperature consideration unit, the temperature measurement unit and the computing unit are embodied such that a temperature of the examination object is measured in that a magnetic resonance signal waveform is compared with those database signal waveforms of the number of database signal waveforms within the temperature range of which the measured temperature of the examination object lies.

According to one form of embodiment of the magnetic resonance device the temperature consideration unit, the temperature measurement unit and the computing unit are embodied such that a temperature of the examination object is measured and such that the determination of the value of the at least one tissue parameter includes:
Determining a provisional value of the at least one tissue parameter on the basis of the signal comparison and
Adapting the provisional value of the at least one tissue parameter to the measured temperature of the examination object.

According to one form of embodiment of the magnetic resonance device the temperature consideration unit is embodied such that the adaptation of the provisional value of the at least one tissue parameter includes a back calculation of the provisional value of the at least one tissue parameter from an initial temperature to the measured temperature of the examination object. According to one form of embodiment of the magnetic resonance device the temperature consideration unit includes a temperature determination unit which is embodied such that a temperature of the examination object is determined on the basis of the determined value of the at least one tissue parameter.

According to one form of embodiment of the magnetic resonance device the temperature consideration unit includes a temperature determination unit, which is embodied such that the temperature of the examination object is determined using calibration data which is determined during a first period of the duration of the detection of the magnetic resonance signal waveform, wherein during the first period a calibration temperature of the examination object is known.

According to one form of embodiment of the magnetic resonance device the temperature consideration unit includes a temperature determination unit, which is embodied such that the determination of the temperature of the examination object includes:

Determining a first value of the at least one tissue parameter based on a first part range of the magnetic resonance signal waveform which is detected during a first period of the duration of the detection of the magnetic resonance signal waveform, wherein during the first period a calibration temperature of the examination object is known, Determining a second value of the at least one tissue parameter on the basis of a second part range of the magnetic resonance signal waveform which is detected during a second period of the duration of the detection of the magnetic resonance signal waveform, wherein the temperature of the examination object to be determined is present during the second period and Determining the temperature of the examination object on the basis of a comparison of the first value and of the second value of the at least one tissue parameter using the known calibration temperature. According to one form of embodiment of the magnetic resonance device the temperature consideration unit includes a temperature determination unit, which is embodied such that the second value of the at least one tissue parameter is determined, taking into consideration the first value of the at least one tissue parameter.

The inventive computer program product is able to be loaded directly into a memory of a programmable computing unit of a magnetic resonance device and has program code means in order to carry out an inventive method when the computer program product is executed in the computing unit of the magnetic resonance device. This enables the inventive method to be executed in a fast, identically-repeatable and robust way. The computer program product is configured so that it can carry out the inventive method steps by means of the computing unit. The computing unit in this case must have the prerequisites, such as for example a corresponding main memory, a corresponding graphics card and a corresponding logic unit, so that the respective method steps can be carried out efficiently. The computer program product is stored for example on a computer-readable medium or is stored on a network or server, from where it can be loaded into the processor of a local computing unit which is directly connected to the magnetic resonance device or can be embodied as a part of the magnetic resonance device. Furthermore control information of the computer program product can be stored on an electronically-readable data medium. The control information of the electronically-readable data medium can be embodied such that, when the data medium is used in a computing unit of a magnetic resonance device, it carries out the inventive method. Examples of electronically-readable data media are a DVD, a magnetic tape or a USB stick on which electronically-readable control information, especially software (cf. above), is stored. If this control information (software) is read from the data medium and stored in a control and/or computing unit of a magnetic resonance device, all inventive forms of embodiment of the previously described method can be carried out. Thus embodiments of the invention can also be based on the said computer-readable medium and/or the said electronically-readable data medium.

The advantages of the inventive magnetic resonance device and of the inventive computer program product essentially correspond to the advantages of the inventive method which have been set out in detail above. Features, advantages or alternate forms of embodiment mentioned here are likewise also to be transferred to the other claimed subject matter and vice versa. In other words the physical claims which are directed to a method for example can also be further developed with the features which are described or claimed in conjunction with a method. The corresponding functional claims of the method are embodied in such cases by corresponding physical modules, especially by hardware modules.

BRIEF DESCRIPTION

Some of the embodiments will be described in detail, with reference to the following figures, wherein like designations denote like members, wherein.

DETAILED DESCRIPTION

Figure 1:
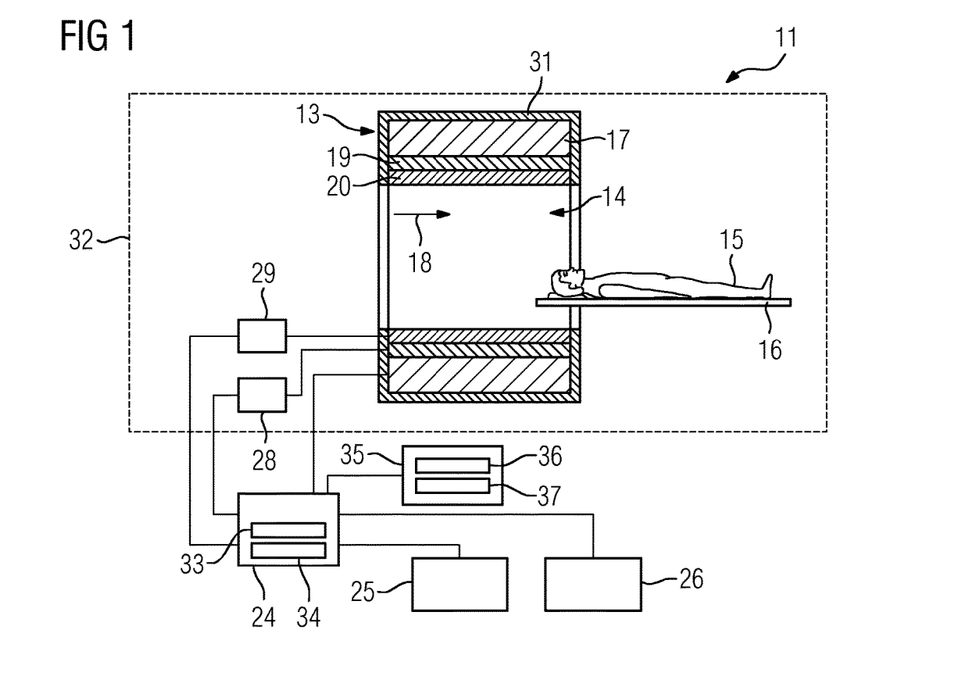
FIG. 1 shows an embodiment of an inventive magnetic resonance device in a schematic diagram.

FIG. 1 shows a schematic of an inventive magnetic resonance device 11. The magnetic resonance device 11 comprises a detector unit formed from a magnet unit 13 with a main magnet 17 for creating a strong and especially constant main magnetic field 18. In addition the magnetic resonance device 11 has a cylindrical patient receiving area 14 for receiving an examination object 15, in the present case a patient 15, wherein the patient receiving area 14 is enclosed in a circumference direction cylindrically by the magnet unit 13. The patient 15 can be pushed by means of a patient support facility 16 of the magnetic resonance device 11 into the patient receiving area 14. The patient support facility 16 has a couch for this purpose which is disposed movably within the magnetic resonance device 11. The magnet unit 13 is shielded by means of housing cladding 31 of the magnetic resonance device.

The magnet unit 13 also has a gradient coil unit 19 for creating magnetic field gradients, which are used for local encoding during imaging. The gradient coil unit 19 is activated by means of a gradient control unit 28. Furthermore the magnet unit 13 has a radio-frequency antenna unit 20, which is embodied in the case shown as a body coil integrated at a fixed location into the magnetic resonance device 10, and a radio-frequency antenna control unit 29 for exciting a polarization which occurs in the main magnetic field 18 created by the main magnet 17. The radio-frequency antenna unit 20 is controlled by means of a radio-frequency antenna control unit 29 and radiates radio-frequency magnetic resonance sequences into an examination area which is essentially formed by the patient receiving area 14. The radio-frequency antenna unit 20 is further embodied for receiving magnetic resonance signals, especially from the patient 15.

To control the main magnet 17, the gradient control unit 28 and the radio-frequency antenna control unit 29 the magnetic resonance device 11 has a computing unit 24. The computing unit 24 controls the magnetic resonance device 11 centrally, such as for example carrying out a predetermined imaging gradient echo sequence. Control information such as for example imaging parameters, and also reconstructed magnetic resonance images, can be provided for a user on a provision unit, in the present case a display unit 25 of the magnetic resonance device 11. In addition the magnetic resonance device 11 has an input unit 26 by means of which information and/or parameters can be entered by a user during a measuring process. The computing unit 24 can include the gradient control unit 28 and/or radio-frequency antenna control unit 29 and/or the display unit 25 and/or the input unit 26.

In the case shown the computing unit 24 includes a comparison unit 33 and a determination unit 34.

The magnetic resonance device 11 further includes a signal waveform detection unit 32. The signal waveform detection unit 32 is formed in the present case by the magnet unit 13 together with the radio-frequency antenna control unit 29 and the gradient control unit 28.

The magnetic resonance device 11 further includes a temperature consideration unit 35. In the case shown the temperature consideration unit 35 includes a temperature measurement unit 36 and a temperature determination unit 37. It is also conceivable for the temperature consideration unit 35 to only include one temperature measurement unit 36 or only one temperature determination unit 37. The temperature consideration unit 35 can also be at least partly a part of the computing unit 24. The magnetic resonance device 11 is designed, together with the signal waveform detection unit 32, the computing unit 24 and the temperature consideration unit 35 for executing an inventive method.

The magnetic resonance device 11 shown can naturally include other components that magnetic resonance devices 11 normally have. A general way in which a magnetic resonance device 11 functions is also known to the person skilled in the art, so that a detailed description of the further components will not be provided.

Figure 2:
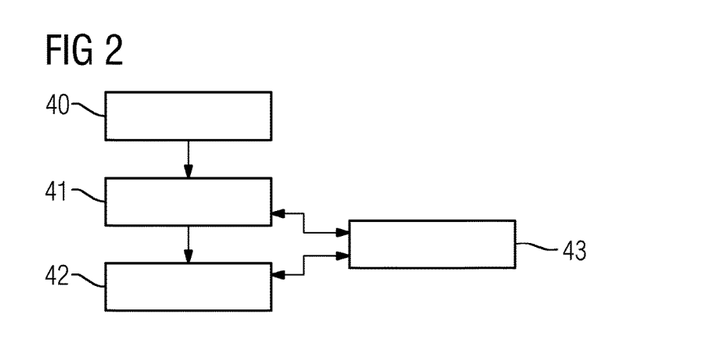
FIG. 2 shows a flowchart of a first form of embodiment of an inventive method.

FIG. 2 shows a flowchart of a first form of embodiment of an inventive method for magnetic resonance fingerprinting.

In a first method step 40 the signal waveform detection unit 32 of the magnetic resonance device 11 detects a magnetic resonance signal waveform of an examination area of the examination object 15 by means of a magnetic resonance fingerprinting method. In the present case for example a number of magnetic resonance images are recorded by means of the magnetic resonance fingerprinting method. The magnetic resonance fingerprinting method in such cases especially includes, during the recording of the magnetic resonance images, the use of recording parameters changed in a pseudo-randomized manner. The magnetic resonance signal waveform is then formed over a number of magnetic resonance images. In particular in such cases a signal waveform is formed especially via each voxel over the number of magnetic resonance images.

In a further method step 41 the detected magnetic resonance signal waveform is compared with a number of database signal waveforms stored in a database by means of the comparison unit 33 of the computing unit 24. The database in this case is especially connected to the computing unit 24 for the purposes of exchanging data. Each of the database signal waveforms is typically assigned a database value of at least one tissue parameter.

Two tissue parameters are to be determined by way of example, namely a T1 relaxation time and a T2 relaxation time. Naturally the at least one tissue parameter can also include a different number of tissue parameters. The at least one tissue parameter can also include other tissue parameters such as for example a diffusion value, (for example an apparent diffusion coefficient, ADC), a magnetization moment, a proton density, a resonant frequency, a concentration of a substance, a temperature, etc. To illustrate this, by way of example, 2900 database values of the T1 relaxation time, which in millisecond steps cover the range of 101 ms to 3000 ms, and 990 database values of the T2 relaxation time, which in millisecond steps cover the range of 11 ms to 1000 ms, should be present. The database accordingly includes by way of example 2871000 database signal waveforms, wherein each of the database signal waveforms is assigned a 2-tuple of T1 relaxation time and T2 relaxation time. The database signal waveforms can be established for example in a simulation for the different database values of the T1 relaxation time and the T2 relaxation time.

The magnetic resonance signal waveform is then compared by way of example with each of the database signal waveforms. The signal comparison can be done by means of a conventional pattern recognition method and/or through a simple correlation analysis. In the signal comparison a comparison parameter is then output for each comparison, which characterizes the degree of matching between the magnetic resonance signal waveform and the database signal waveforms.

In a further method step 42 a value of the at least one tissue parameter is determined on the basis of the signal comparison by means of the determination unit 34 of the computing unit 24. In the signal comparison a matching database signal waveform of the number of database signal waveforms is then established which has the greatest match to the magnetic resonance signal waveform. The T1 relaxation time and T2 relaxation time then belonging to the matching database signal waveform can then be set as the value of the at least one tissue parameter.

In a further method step 43 an influence of a temperature of the examination object 15 on the magnetic resonance signal waveform is taken into consideration in the further processing of the magnetic resonance signal waveform by means of the temperature consideration unit 35. The influence of the temperature can be taken into consideration during the signal comparison in the further method step 41 and/or in the determination of the value of the at least one tissue parameter in the further method step 42. As an alternative or in addition, taking the temperature of the examination object 15 into consideration can also include a determination of the temperature, especially based on the signal comparison in the further method step 41 and/or in the further method step 42 of the at least one tissue parameter.

Figure 3:
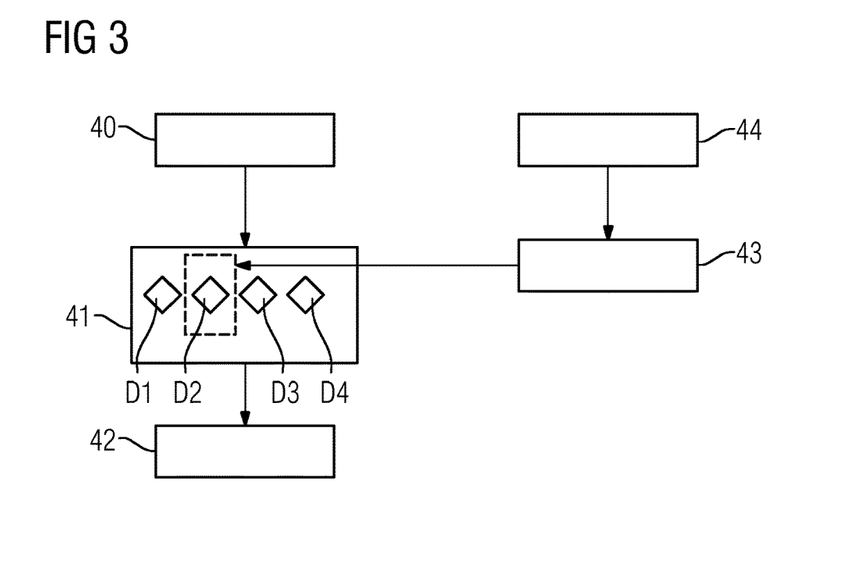
FIG. 3 shows a flowchart of a second form of embodiment of an inventive method.

FIG. 3 shows a flowchart of a second form of embodiment of an inventive method for magnetic resonance fingerprinting.

The description given below is essentially restricted to the differences from the exemplary embodiment in FIG. 2, wherein, as regards method steps which remain the same, the reader is referred to the description of the exemplary embodiment in FIG. 2. Method steps which essentially remain the same are basically given the same reference numbers.

The second form of embodiment of the inventive method shown in FIG. 3 essentially comprises the method steps 40, 41, 42, 43 of the first form of embodiment of the inventive method according to FIG. 2. In addition the second form of embodiment of the inventive method shown in FIG. 3 contains additional method steps and substeps. An alternate method sequence to that shown in FIG. 3 is also possible, which has only some of the additional method steps and/or substeps shown in FIG. 2. Naturally an alternate method sequence to that shown in FIG. 3 can also have additional method steps and/or substeps.

In a further method step 44 a temperature of the examination object 15 is measured by means of a temperature measurement by means of the temperature measurement unit 36 at a defined point in the examination object 15. The temperature is measured by way of example by means of a magnetic resonance fingerprinting method. The temperature is measured in this case during or shortly before the detection of the magnetic resonance signal waveform in further method step 40. Thus the measured temperature represents that temperature which is present during the detection of the magnetic resonance signal waveform.

For the signal comparison in further method step 41, each of the database signal waveforms stored in the database is assigned a temperature range. The database is thus embodied in the form of a temperature-dependent database. In the case shown in FIG. 3 the database is divided up into four temperature ranges D1, D2, D3, D4 by way of example. The first temperature range D1 applies by way of example for temperatures less than 36° C. The second temperature range D2 applies by way of example for temperatures greater than or equal to 36° C. and less than 38° C. The third temperature range D3 applies by way of example for temperatures greater than or equal to 38° C. and less than 40° C. The fourth temperature range D4 applies by way of example for temperatures greater than or equal to 40° C. Naturally a different number of temperature ranges with other temperature limits is also conceivable. Referring back to the example described in FIG. 2, the 2871000 database signal waveforms, which are each assigned a 2-tuple of the T1 relaxation time and T2 relaxation time, are contained four times in the database, namely once for each temperature range. The database thus comprises 11484000 database signal waveforms. For example the database signal waveform which belongs to the database values 500 ms for the T1 relaxation time and 90 ms for the T2 relaxation times is stored four times in the database, namely once for the first temperature range D1, once for the second temperature range D2, once for the third temperature range D3 and once for the fourth temperature range D4. For this the database signal waveform has typically also been simulated four times with different underlying temperatures.

Taking the temperature into consideration in further method step 43 now proceeds such that the temperature consideration unit 35 accesses the temperature measured in further method step 44 by the temperature measurement unit 36 and establishes the associated temperature range D1, D2, D3, D4. The magnetic resonance signal waveform detected in the further method step 40 is compared to those database signal waveforms of the number of database signal waveforms in the temperature range of which the measured temperature of the examination object 15 lies. In the present case a temperature of 37° C. has typically been measured, which lies in the second temperature range D2. Thus the magnetic resonance signal waveform is compared with those 2871000 database signal waveforms which are assigned to the second temperature range D2 of the database. To this extent the value of the at least one tissue parameter is determined in the further method step 42, taking the temperature of the examination object 15 into consideration.

Figure 4:
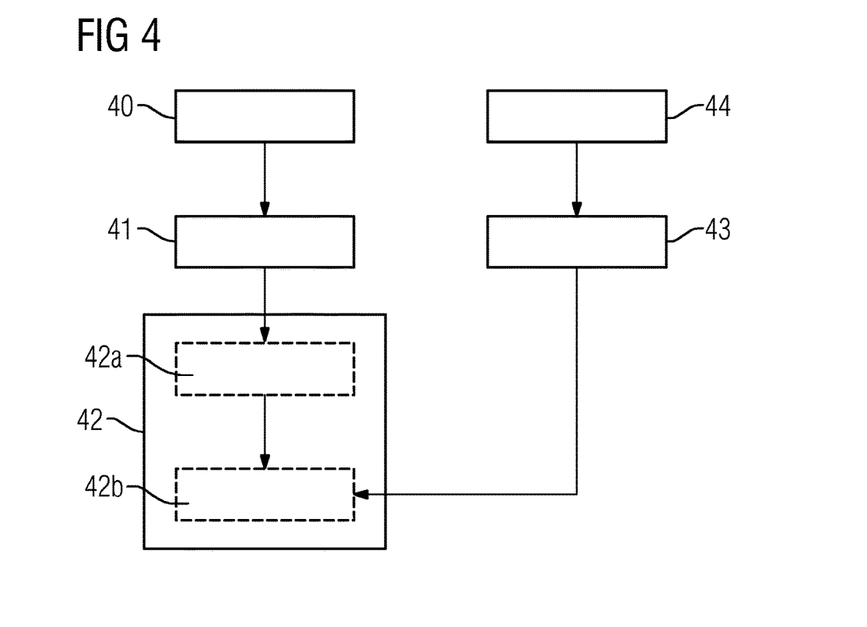
FIG. 4 shows a flowchart of a third form of embodiment of an inventive method.

FIG. 4 shows a flowchart with a further form of embodiment of an inventive method for magnetic resonance fingerprinting.

The description given below is essentially restricted to the differences from the exemplary embodiment in FIG. 3, wherein, as regards method steps which remain the same, the reader is referred to the description of the exemplary embodiment in FIG. 3. Method steps which essentially remain the same are basically given the same reference numbers.

The third form of embodiment of the inventive method shown in FIG. 4 essentially comprises the method steps 40, 41, 42, 43, 44 of the second form of embodiment of the inventive method according to FIG. 3. In addition the third form of embodiment of the inventive method shown in FIG. 4 contains additional method steps and substeps. An alternate method sequence to that shown in FIG. 4, which only contains some of the additional method steps and/or substeps shown in FIG. 4, is also conceivable. Naturally an alternate method sequence to that shown in FIG. 4 can also have additional method steps and/or substeps.

The exemplary embodiment shown in FIG. 4 principally differs from the exemplary embodiment shown in FIG. 3 in that the temperature of the examination object 15 in further method step 43 is not taken into consideration during the signal comparison in further method step 41, but during the determination of the value of the at least one tissue parameter in further method step 42. Naturally both procedures can also be combined with one another.

The temperature of the examination object 15 is taken into consideration such that the further method step 42 includes a first substep 42a, during which initially a provisional value of the at least one tissue parameter is determined on the basis of the signal comparison by means of the determination unit 34 of the computing unit 24. In the determination of this provisional value in particular no temperature of the examination object 15 is included. The provisional value of the at least one tissue parameter is then adapted to the temperature of the examination object 15 measured in further method step 44 in a second substep 42b of the further method step 42.

The adaptation of the provisional value of the at least one tissue parameter includes a back calculation of the provisional value of the at least one tissue parameter from an initial temperature to the measured temperature of the examination object 15. The back calculation is undertaken in this case especially on the basis of a known temperature dependency of the at least one tissue parameter. Using the T1 relaxation time (T1) as an example in this case an exponential waveform is typically to be applied, wherein T is the temperature measured in further method step 44, TA the initial temperature and X a constant:

$$T1(T)=T1(TA)*\exp(X/T)$$

The constant X can be determined for example when the T1 relaxation times of the tissue are known from at least two different temperatures. The constant X can be stored in a tissue-dependent further database.

Figure 5:
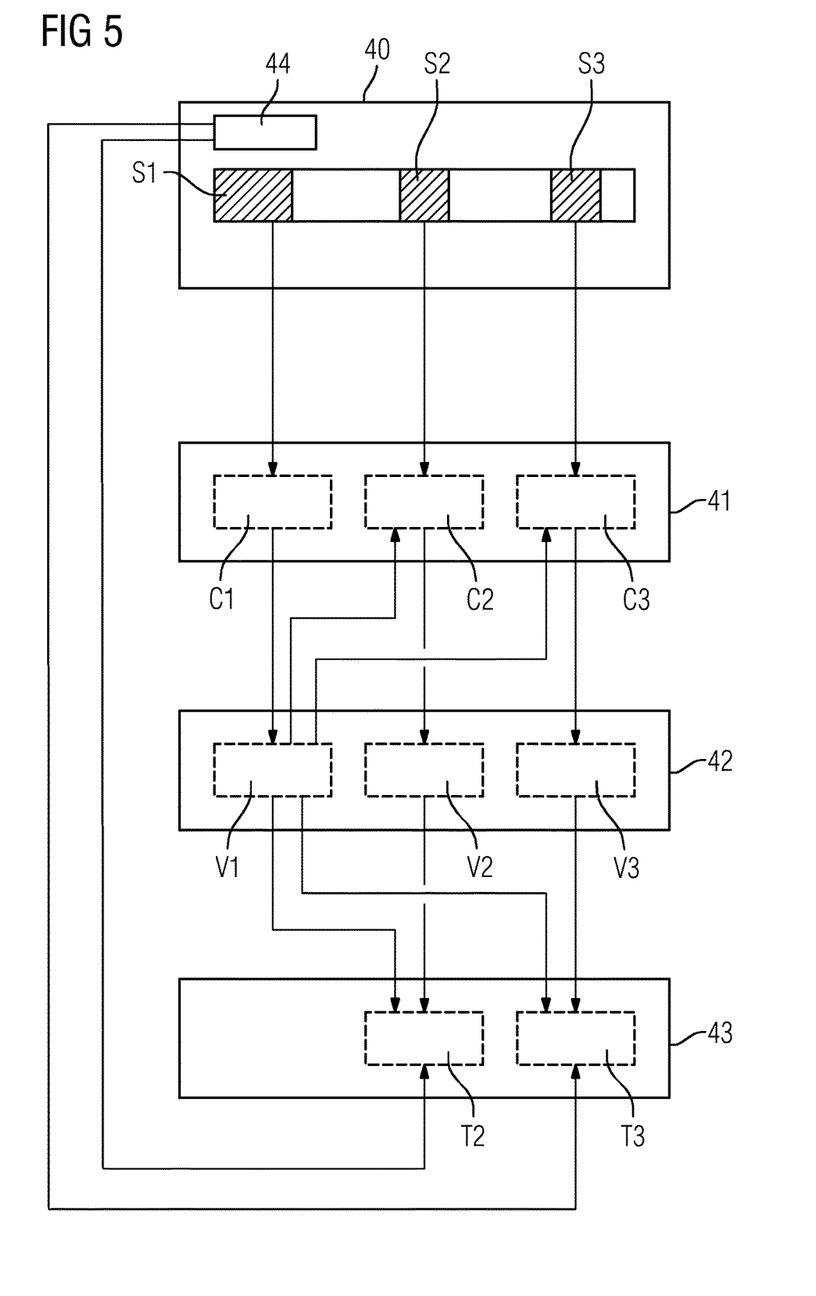
FIG. 5 shows a flowchart of a fourth form of embodiment of an inventive method.

FIG. 5 shows a flowchart with a fourth form of embodiment of an inventive method for magnetic resonance fingerprinting.

The description given below is essentially restricted to the differences from the exemplary embodiment in FIG. 2, wherein, as regards method steps which remain the same, the reader is referred to the description of the exemplary embodiment in FIG. 2. Method steps which essentially remain the same are basically given the same reference numbers.

The fourth form of embodiment of the inventive method shown in FIG. 5 essentially includes the method steps 40, 41, 42, 43 of the first form of embodiment of the inventive method according to FIG. 2. In addition the fourth form of embodiment of the inventive method shown in FIG. 5 includes additional method steps and substeps. An alternate method sequence to that shown in FIG. 5, which only contains some of the additional method steps and/or substeps shown in FIG. 2 is also conceivable. Naturally an alternate method sequence to that shown in FIG. 5 can also have additional method steps and/or substeps.

In the exemplary embodiment shown in FIG. 5 taking the temperature into consideration in further method step 43 includes a determination of the temperature of the examination object 15 by means of the temperature determination unit 37 of the temperature consideration unit 35. In particular in this case, in further method step 43 a number of temperatures, in the case shown a second temperature T2 and a first temperature T3, of the examination object 15 are determined. In a similar manner a temperature curve of the examination object 15 can be determined with a number of temperatures.

The temperature in this case is determined in further method step 43 based on the value of the at least one tissue parameter determined in further method step 42. The temperature of the examination object 15 is determined using calibration data, which is determined during a first period of the duration of detecting the magnetic resonance signal waveform, wherein during the first period a calibration temperature of the examination object 15 is known.

During this first period of the detection of the magnetic resonance image data, a first part range S1 of the magnetic resonance signal waveform is determined. During the first period a calibration temperature is also measured in further method step 44. During a second period of the detection of the magnetic resonance image data a second part range S2 of the magnetic resonance signal waveform is determined. During this second period the second temperature of the examination object 15 is available. Likewise during a third period of the detection of the magnetic resonance image data a third part range S3 of the magnetic resonance signal waveform is determined. During this third period the third temperature of the examination object 15 to be determined is present.

In further method step 41 signal comparisons C1, C2, C3 of the part ranges S1, S2, S3 of the magnetic resonance signal waveform with the associated sections of the database signal waveforms are undertaken. Thus the entire signal waveforms are not compared such as in FIG. 3 or FIG. 4 for example, but only use corresponding subsets of the signal waveforms. In a first signal comparison C1 the first part range S1 of the magnetic resonance signal waveform is compared with the corresponding sections of the signal waveforms, etc.

In further method step 42 on the basis of the signal comparisons C1, C2, C3 for each part range S1, S2, S3 of the magnetic resonance signal waveform, a value V1, V2, V3 of the at least one tissue parameter is determined. The three values V1, V2, V3 of the at least one tissue parameter are then different, if compared to the calibration temperature on which the first value V1 is based, the temperature of the examination object 15 differs during the detection of the second part range S2 or third part range S3 of the magnetic resonance signal waveform.

In further method step 43 the temperature determination unit 37 can then determine the second temperature T2 of the examination object 15 on the basis of the second value V2 of the at least one tissue parameter, the first value V1 of the at least one tissue parameter and the calibration temperature. Furthermore the temperature determination unit 37 can determine the third temperature T2 of the examination object 15 on the basis of the third value V3 of the at least one tissue parameter, the first value V1 of the at least one tissue parameter and the calibration temperature. The formula given in FIG. 4 can be employed for determining the temperatures for example.

Furthermore it is also conceivable for the second value V2 of the at least one tissue parameter to be determined taking into account the first value V1 of the at least one tissue parameter. In precisely the same way the third value V3 of the at least one tissue parameter can be determined taking into account the first value V1 of the at least one tissue parameter. Here in particular a restriction of the database signal waveforms as a function of the first value V1 of the at least one tissue parameter is considered.

The method steps of the inventive method shown in FIG. 2-5 are carried out by the computing unit 24 of the magnetic resonance device 11. For this purpose the computing unit 24 includes the necessary software and/or computer programs, which are stored in a memory unit of the computing unit. The software and/or computer programs include program means, which are designed to carry out the inventive method when the computer program and/or the software is executed in the computing unit 24 by means of a processor unit of the computing unit 24.

Although the invention has been illustrated and described in greater detail by the preferred exemplary embodiments, the invention is not however restricted by the disclosed examples and other variations can be derived here from by the person skilled in the art, without departing from the scope of protection of the invention.

The invention claimed is:

1. A method for magnetic resonance fingerprinting, comprising the following method steps:
    detecting a magnetic resonance signal waveform of an examination area of an examination object by means of a magnetic resonance fingerprinting method;
    comparing the detected magnetic resonance signal waveform with a number of signal waveforms stored in a database, wherein a database value of at least one tissue parameter is assigned to each of the database signal waveforms; and
    determining a value of the at least one tissue parameter on a basis of the signal comparison,
    wherein an influence of a temperature of the examination object on the magnetic resonance signal waveform is taken into consideration in the further processing of the magnetic resonance signal waveform;
    wherein each of the database signal waveforms stored in the database is assigned a temperature range;
    wherein a temperature of the examination object is measured and that the magnetic resonance signal waveform is compared to those database signal waveforms of the number of database signal waveforms in the temperature range of which the measured temperature of the examination object lies.

2. The method as claimed in claim 1, wherein a temperature of the examination object is measured by means of a temperature measurement at a defined point in the examination object by means of a magnetic resonance fingerprinting method.

3. The method as claimed in claim 1, wherein a temperature of the examination object is measured and that the determination of the value of the at least one tissue parameter includes:
    determining a provisional value of the at least one tissue parameter on the basis of the signal comparison and adapting the provisional value of the at least one tissue parameter to the measured temperature of the examination object.

4. The method as claimed in claim 3, wherein the adaptation of the provisional value of the at least one tissue parameter includes a back calculation of the provisional value of the at least one tissue parameter from an initial temperature to the measured temperature of the examination object.

5. The method as claimed in claim 1, wherein a temperature of the examination object is determined on the basis of the determined value of the at least one tissue parameter.

6. The method as claimed in claim 5, wherein the temperature of the examination object is determined using calibration data which is determined during a first period of the duration of the detection of the magnetic resonance signal waveform, wherein a calibration temperature of the examination object is known during the first period.

7. The method as claimed in claim 5, wherein the determination of the temperature of the examination object includes:
determining a first value of the at least one tissue parameter based on a first part range of the magnetic resonance signal waveform which is detected during a first period of the duration of the detection of the magnetic resonance signal waveform, wherein a calibration temperature of the examination object is known during the first period, determining a second value of the at least one tissue parameter on the basis of a second part range of the magnetic resonance signal waveform which is detected during a second period of the duration of the detection of the magnetic resonance signal waveform, wherein the temperature of the examination object to be determined is present during the second period and
determining the temperature of the examination object on the basis of a comparison of the first value and the second value of the at least one tissue parameter using the known calibration temperature.

8. The method as claimed in claim 7, wherein the second value of the at least one tissue parameter is determined taking into account the first value of the at least one tissue parameter.

9. A magnetic resonance device including a signal waveform detection unit, a computing unit and a temperature consideration unit, wherein the magnetic resonance device is designed to carry out a method as claimed in claim 1.

10. A computer program product loaded directly into a memory of a programmable computing unit of a magnetic resonance device, with program code means for carrying out a method comprising:
detecting a magnetic resonance signal waveform of an examination area of an examination object by means of a magnetic resonance fingerprinting method;
comparing the detected magnetic resonance signal waveform with a number of signal waveforms stored in a database, wherein a database value of at least one tissue parameter is assigned to each of the database signal waveforms; and
determining a value of the at least one tissue parameter on a basis of the signal comparison,
wherein an influence of a temperature of the examination object on the magnetic resonance signal waveform is taken into consideration in the further processing of the magnetic resonance signal waveform;
wherein each of the database signal waveforms stored in the database is assigned a temperature range;
wherein a temperature of the examination object is measured and that the magnetic resonance signal waveform is compared to those database signal waveforms of the number of database signal waveforms in the temperature range of which the measured temperature of the examination object lies.

11. A method for magnetic resonance fingerprinting, comprising the following method steps:
detecting a magnetic resonance signal waveform of an examination area of an examination object by means of a magnetic resonance fingerprinting method;
comparing the detected magnetic resonance signal waveform with a number of signal waveforms stored in a database, wherein a database value of at least one tissue parameter is assigned to each of the database signal waveforms; and
determining a value of the at least one tissue parameter on a basis of the signal comparison,
wherein an influence of a temperature of the examination object on the magnetic resonance signal waveform is taken into consideration in the further processing of the magnetic resonance signal waveform;
wherein a temperature of the examination object is measured and that the determination of the value of the at least one tissue parameter includes:
determining a provisional value of the at least one tissue parameter on the basis of the signal comparison and adapting the provisional value of the at least one tissue parameter to the measured temperature of the examination object.

12. A method for magnetic resonance fingerprinting, comprising the following method steps:
detecting a magnetic resonance signal waveform of an examination area of an examination object by means of a magnetic resonance fingerprinting method;
comparing the detected magnetic resonance signal waveform with a number of signal waveforms stored in a database, wherein a database value of at least one tissue parameter is assigned to each of the database signal waveforms; and
determining a value of the at least one tissue parameter on a basis of the signal comparison,
wherein an influence of a temperature of the examination object on the magnetic resonance signal waveform is taken into consideration in the further processing of the magnetic resonance signal waveform;
wherein a temperature of the examination object is determined on the basis of the determined value of the at least one tissue parameter.

* * * * *